(12) United States Patent
Osborn et al.

(10) Patent No.: US 6,680,850 B2
(45) Date of Patent: Jan. 20, 2004

(54) ELECTRONICS ASSEMBLY

(75) Inventors: Jay Kevin Osborn, Crowthorne (GB); Sean Conor Wrycraft, Harrow (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/166,512

(22) Filed: Jun. 10, 2002

(65) Prior Publication Data
US 2003/0227754 A1 Dec. 11, 2003

(51) Int. Cl.⁷ .................................................. H05K 7/00
(52) U.S. Cl. ...................... 361/729; 361/801; 361/759; 361/740; 361/829; 361/754; 361/725
(58) Field of Search ................................ 361/729, 801, 361/759, 740, 732, 726, 754, 788, 829, 725

(56) References Cited

U.S. PATENT DOCUMENTS

| | | | |
|---|---|---|---|
| 4,083,616 A | * | 4/1978 | McNiece et al. ............ 439/157 |
| 5,216,578 A | * | 6/1993 | Zenitani et al. ............. 361/690 |
| 5,373,133 A | * | 12/1994 | Brockway et al. ........... 200/335 |
| 6,395,976 B1 | * | 5/2002 | Koradia et al. ........ 174/35 GC |

* cited by examiner

Primary Examiner—David Martin
Assistant Examiner—Hung Bui
(74) Attorney, Agent, or Firm—Meyertons Hood Kivlin Kowert & Goetzel, P.C.; B. Noël Kivlin

(57) ABSTRACT

An electronics assembly comprises a frame (1) that contains a motherboard (8) and a plurality of daughterboards (10). The frame has an opening opposite the motherboard to allow insertion of the daughterboards into the frame or removal of the daughterboards from the frame. The frame also has an injector/ejector mechanism (16, 18) for each daughterboard that is located on the daughterboard or the frame and a flange (28) that extends adjacent to the opening and on which the injector/ejector mechanism of each daughterboard is attached or engages at different locations along the length thereof. The flange (28) is divided into separate sections (30) that correspond to the different locations to allow the flange to flex at any adjacent location during insertion of a daughterboard without the flexing affecting the position of any adjacent location of the flange with respect to the motherboard.

10 Claims, 3 Drawing Sheets

ELECTRONICS ASSEMBLY

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANS), telecommunications systems or other operations such as database management or as internet servers.

Such an assembly will typically comprise a supporting frame that houses a motherboard or backplane and a number of daughterboards or module cards that extend in planes generally perpendicular to the plane of the motherboard and which are connected to the motherboard by connectors, e.g. high density connectors, so that the daughterboards can simply be introduced into the frame through an opening therein opposite the motherboard, located on guides and pushed toward the motherboard in order to connect them to it.

Each daughterboard usually requires multiple electrical connections which are generally provided by two-part multipin electrical connectors, one part of which is located at the rear of the daughterboard and the other part provided on the motherboard.

In order to engage the daughterboard and the motherboard connectors properly during insertion, and to aid removal of the daughterboards, it is common to employ injector/ejector mechanisms. An injector/ejector mechanism is operated by a user and is intended to ensure an appropriate even force to be applied to the electrical connectors between the motherboard and the daughterboards during insertion of the daughterboard, to lock the daughterboard in place during operation of the system and to aid disconnection of the electrical connectors during removal of the daughterboard. The most common form of injector/ejector mechanism comprises a lever arm that can be pivotally located on a flange on the frame at or adjacent to the opening or, more usually, located on the daughterboard and engage the flange, in order to provide a mechanical advantage during connection or disconnection.

One problem that has been encountered with such assemblies, however, is ensuring correct electrical connection between the daughterboards and the motherboard due to dimensional tolerances in the daughterboards and other parts of the assembly. The daughterboards may, for example, have typical dimensions in the region of 500 mm in the insertion and removal direction whereas the connectors may have a length of travel between initial contact of the pins and complete mating of the connectors, or so-called "wipe", as low as 0.5 to 0.8 mm, with the result that because of tolerances in the length of the daughterboards, some connectors may be overstressed while other connectors may not form a good connection. This problem is particularly severe if daughterboards toward the end of an array are relatively long and cause the flange to bow, while daughterboards at the centre of the array are relatively short.

This problem may be resolved by providing a flexible coupling in the injector/ejector mechanism to allow relative movement of a daughterboard away from the motherboard while applying a biasing force toward the motherboard. Although such a system is perfectly adequate in resolving the problem, it requires discrete components to be incorporated in each injector/ejector mechanism and is therefore relatively expensive to implement.

SUMMARY OF THE INVENTION

According to one aspect, the present invention provides an electronics assembly which comprises a frame that contains a motherboard and a plurality of daughterboards that extend in a plane generally perpendicular to the plane of the motherboard and are connected to the motherboard by means of connectors, the frame having:

(i) an opening opposite the motherboard to allow insertion of the daughterboards into the frame or removal of the daughterboards from the frame in a direction normal to the plane of the motherboard;

(ii) an injector/ejector mechanism for each daughterboard that is located on the daughterboard or the frame and engages the frame or the daughterboard respectively in a region adjacent to the opening; and (iii) a flange that extends therealong at or adjacent to the opening and on which the injector/ejector mechanism of each daughterboard is attached or engages at different locations along the length thereof, wherein the flange is divided into separate sections that correspond to the different locations to allow the flange to flex at any location therealong during insertion of a daughterboard without the flexing affecting the position of any adjacent location of the flange with respect to the motherboard.

According to another aspect, the present invention provides a frame for an electronics assembly which comprises a location in which a planar motherboard can be received and a plurality of guides that extend in a direction generally normal to the plane of the motherboard when it is received in the frame in order to enable a plurality of daughterboards to be located in the frame in engagement with the motherboard, the frame having:

(i) an opening opposite the location for the motherboard to allow insertion of the daughterboards into the frame or removal of the daughterboards from the frame; and (ii) a flange that extends therealong at or adjacent to the opening and along which an injector/ejector mechanism for each daughterboard is attached or can engage at different locations along the length thereof;

wherein the flange is divided into separate sections that correspond to the different locations to allow the flange to flex at any location therealong during insertion of a daughterboard without the flexing affecting the position of any adjacent location of the flange with respect to the location of the motherboard.

The assembly and frame according to the invention enable daughterboards of different dimensional tolerances to be accommodated within the frame and biased into engagement with the motherboard in a particularly inexpensive manner since no discrete biasing components are required.

The injector/ejector mechanism for each daughterboard may, for example, comprise a lever arm that is located on the daughterboard and engages the flange or is located on the flange and engages the daughterboard. Usually the injector/ejector mechanism will be in the form of a lever arm that is pivotally attached to the daughterboard and has a relatively short (i.e. in relation to the arm) projection that engages the flange and moves the daughterboard toward the motherboard when the lever arm is moved toward the front edge of the daughterboard so that it provides a degree of mechanical advantage during insertion of the daughterboard.

Although only one injector/ejector mechanism has been referred to in respect of each daughterboard, the assembly will usually have two such mechanisms for each daughterboard, one mechanism being located at each end of the front edge of the daughterboard or on each side of the opening and the frame will accordingly have a flange on each side of the opening.

The frame will normally have a strengthening member that extends along a side thereof, and usually along both sides thereof, in the region of the opening in order to provide the frame with rigidity in the plane of the daughterboards. That is to say, the or each strengthening member will extend along the or each side of the opening in a direction normal to the plane of the daughterboards in order to reduce the degree to which the or each side of the strengthening member bows out in a direction in the plane of the daughterboards. Typically the strengthening member will extend parallel to and adjacent to the flange. It may be formed separately from the flange, for example where the flange is formed by folding a front edge portion of the material forming the sides of the frame, and attached to the sides of the frame in any appropriate manner. Alternatively, if the strengthening member and the flange are in close proximity to one another, it may be convenient to form them both from the same element. For example, they may both be formed together as a beam having a substantially "C" or "S"-shaped cross-section where one side web of the beam constitutes the flange and a web forming the other side of the beam constitutes the strengthening member.

Such a form of beam is novel per se and so, according to another aspect, the invention comprises an abutment beam for engaging a plurality of injector levers for urging daughterboards onto final engagement with a motherboard in an electronic circuit housed in a casing, the abutment beam having a first web attachable to the housing and a second web comprising a plurality of separated locations for engaging the injector levers, each location of the second web being independently flexible relative to the first web.

Whether the flange and the strengthening member are formed as separate parts or are formed together, the strengthening member is advantageously arranged on the side of the flange between the flange and the motherboard. Such an arrangement enables the injector/ejector mechanism, for example the projection of the lever arm, to bear on the flange when the daughterboard is inserted into the frame and the connectors of the daughterboard and the motherboard are mated, and also when the daughterboards are retained in position in engagement with the motherboard during operation. In this way, resilient deformation of the separate sections of the flange will exert a bias force on the daughterboards to maintain the connectors in engagement while accommodating any difference in dimensions of the daughterboards. On the other hand, no such resilient deformation is required when the daughterboards are removed and so the injector/ejector mechanism can bear on the strength member.

The flange may be divided into the separate sections by forming discontinuities such as slots or slits therein at the appropriate positions, for example by sawing or shearing. There is a relatively large degree of freedom in the depth of the slots, although to increase the distance over which the different sections of the flange may move, the depth of the slots may be as great as the flange width so that a "C" section beam would be cut into a corner of its cross-section. Indeed, the slot depth may be greater where the beam is attached to a side wall of the frame since the wall itself will provide rigidity in the direction of insertion or removal of the daughterboards. There is, however, not usually any advantage in increasing the depth of the slots or slits beyond the width of the flange, and where no side wall is present the strength of any strengthening member in the direction of insertion or removal will be reduced.

Other forms of assembly and frame may be employed within the scope of the invention. More than one flange and/or strengthening member may be arranged on each side of the opening, for example, or the flange and/or the strengthening member may be formed separately as beams having an "L"-shaped cross-section. In addition, instead of a lever arm having a single projection that bears on different surfaces (the flange and the strengthening member) for insertion and removal of the daughterboards, two projections may be provided on the lever arm that bear on opposite sides of the flange so that one projection is employed for insertion and the other is employed for removal.

It is not necessary for the flange and/or the strengthening member to be formed from the same material as each other or as the side wall of the frame but may be formed, for example, from plastics material thereby allowing a different degree of flexibility or rigidity.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Figure 1:
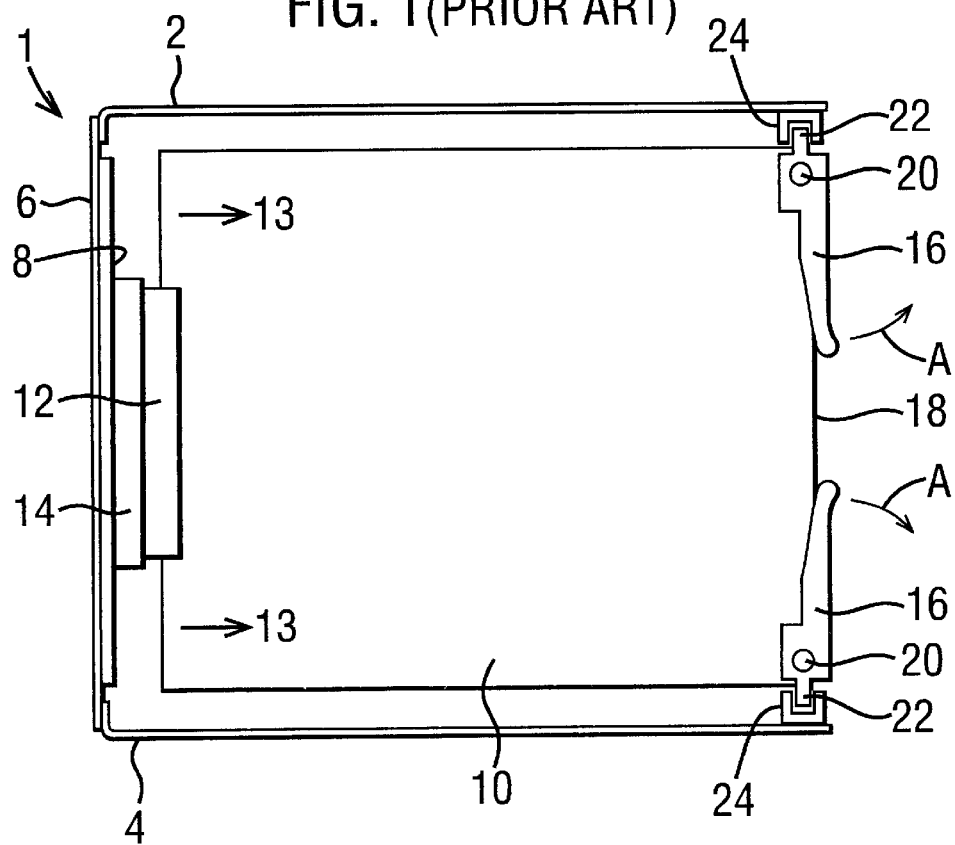
FIG. 1 is a side view of a daughterboard in a conventional electronics assembly.

Referring now to the drawings, in which like reference numerals are used to designate corresponding elements, FIG. 1 shows part of a conventional electronics assembly in which a frame 1 forming part of the chassis of the assembly has two side walls 2 and 4 and a rear wall 6 that houses a pcb forming a backplane or motherboard 8. Opposite the motherboard 8 is an opening through which a daughterboard 10 can be inserted into the frame or removed therefrom. The daughterboard can be inserted into the frame and slid along guides (not shown) toward the motherboard until a multi-contact connector 12 on the daughterboard mates with a corresponding multi-contact connector 14 on the motherboard.

In order to facilitate mating of the connectors 12 and 14 during insertion of the daughterboard, and also disconnection of the connectors during removal of the daughterboard, two injector/ejector arrangements are provided in the form of a lever arm 16 that is located on each side of the front edge 18 of the daughterboard and pivotal about a pivot axis 20 thereon. The lever arm 16 has a short projection 22 which is located between opposite sides of a beam 24 of substantially "C"-shaped cross-section when the daughterboard is, as shown, fully inserted into frame and engaged with the motherboard connector 14. The daughterboard can be moved out of engagement with the motherboard connector 14 by pulling the lever arms in the direction of arrows A which causes the projection 22 to bear on the inner web or side arm 26 of the beam 24 and eject the daughterboard in the direction of arrows 13. The same actions in reverse will cause the daughterboard to be received within the frame 1 with the connectors 12 and 14 mated, and the projection 22 bearing on the outer side arm or flange 28 in order to keep the daughterboards in place.

Figure 2:
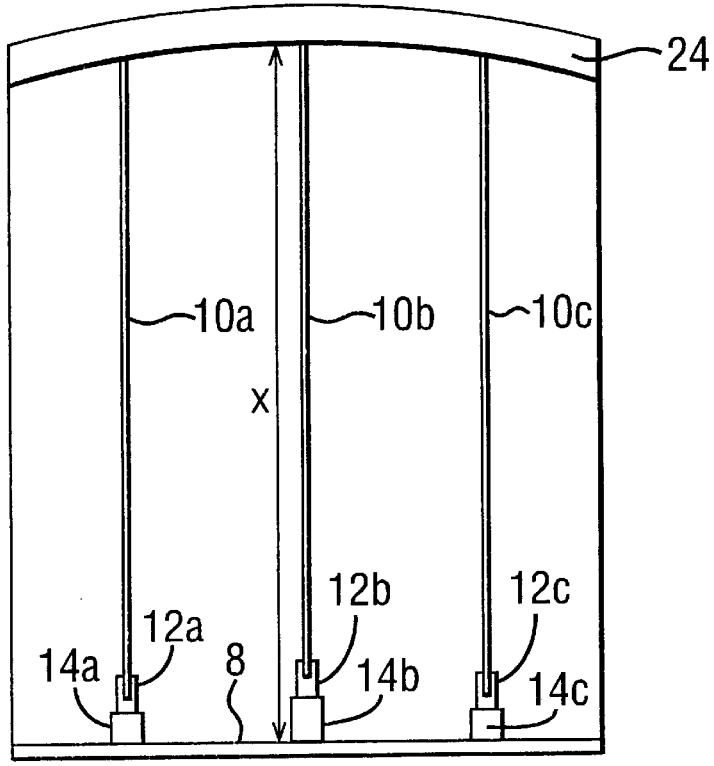
FIG. 2 is a view taken along the planes of the daughterboards of the assembly of FIG. 1.

FIG. 2 is a schematic view of the frame shown in FIG. 1 with three daughterboards 10a, 10b and 10c in place in which the two daughterboards 10a and 10c toward the edges of the frame are relatively large due to dimensional tolerances. This can cause the beam 24 to bow outwards (the degree of bowing is grossly exaggerated for the sake of clarity) and cause the distance X between the beam and the motherboard to be increased. If the middle daughterboard 10b is itself relatively short this can cause inadequate mating of the connectors 12b and 14b. In addition, the outer daughterboards are subject to stress.

Figure 3:
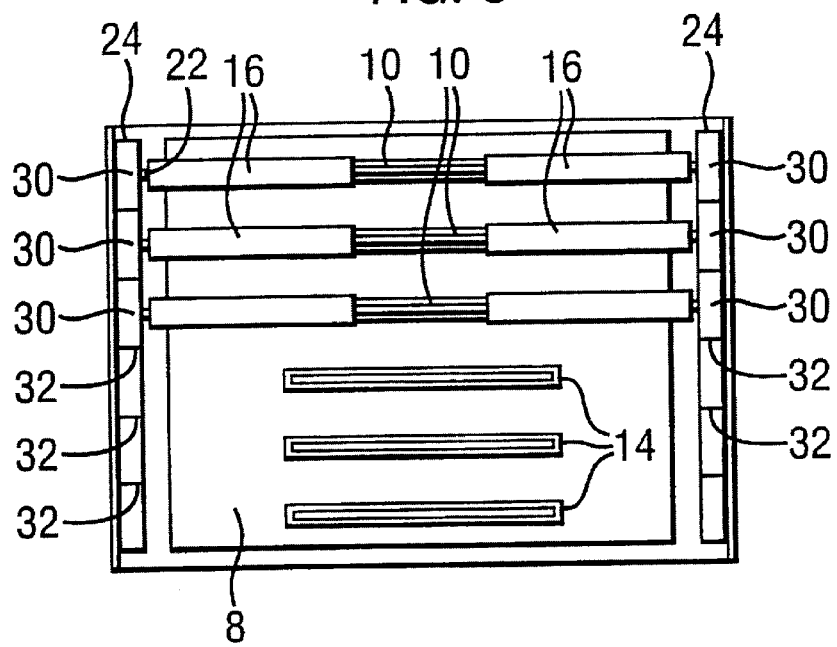
FIG. 3 is a top plan view of an electronics assembly according to one embodiment of the present invention.
Figure 4:
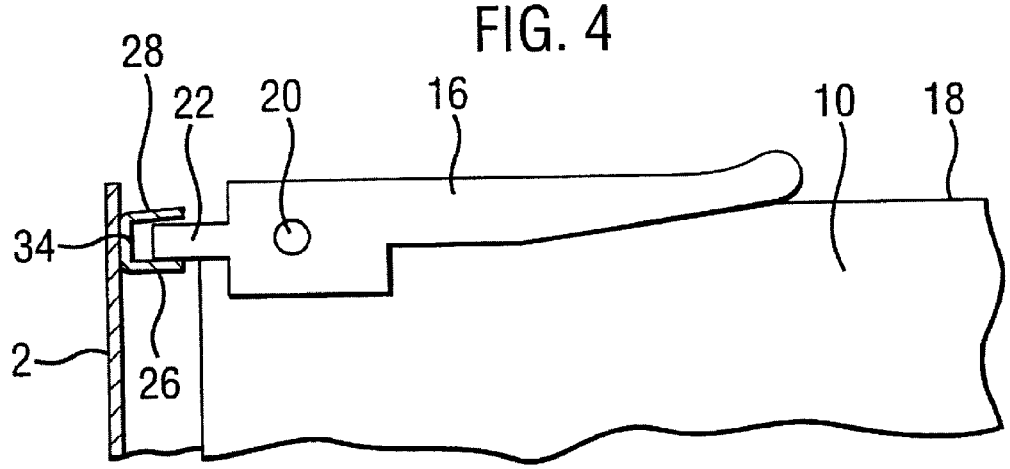
FIG. 4 is an enlarged view of a lever arm of the assembly shown in FIG. 3.

FIG. 3 shows one form of assembly according to the invention seen through the opening for insertion of the daughterboards, while FIG. 4 shows the engagement of one of the lever arms in greater detail and FIG. 4 is a side view of part of the beam 24 with the daughterboards in place. Three daughterboards 10 are inserted into their positions in the frame and three slots for the daughterboards are vacant, exposing connectors 14 on the motherboard.

Figure 5:
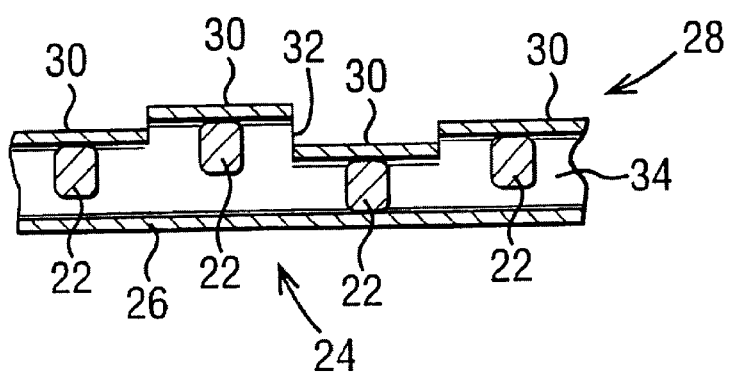
FIG. 5 is a view of part of the assembly of FIG. 3 taken along the planes of the daughterboards.

Instead of having a pair of continuously formed side arms, the innermost side arm 26 of the beam 24 is continuous while the outermost side arm 28 that forms the flange against which the projections 22 of the lever arms 16 bear during insertion, is divided into separate sections 30 by means of slots 32 that extend up to the middle portion 34 of the beam. By dividing this flange into separate sections 30, each section is capable of flexing to a different degree, as shown in FIG. 5, to accommodate differences in length of the various daughterboards without affecting the distance of the adjacent section 30 to the motherboard, so that all the daughterboards can be accommodated without being overstressed or forming a poor electrical connection to the motherboard. The innermost side arm 26 of the beam 24 is not divided into sections so that it will still provide strengthening and rigidity for the side wall in the region of the front opening of the frame. Indeed, if the frame forms a card cage within a larger chassis, there may not be any side wall of the frame. In addition, the innermost side arm 26 that forms the strengthening member provides a surface against which the projections 22 on the lever arms 16 can bear when the daughterboard is ejected.

The beam may be formed from the same material as that of the frame and may be spot-welded, riveted or screwed in place, or it may be formed from a different material, for example plastics. In addition, the arrangement may be designed so that, even with a daughterboard 10 at the shortest end of the tolerance range, the daughterboard is held with a bias against the motherboard connector.

Figure 6:
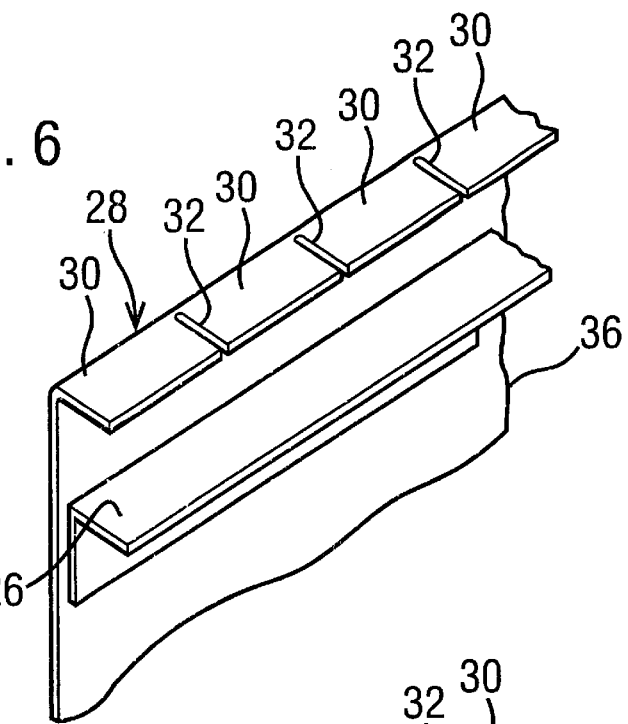
FIG. 6 is an isometric view of part of another embodiment of the present invention.
Figure 7:
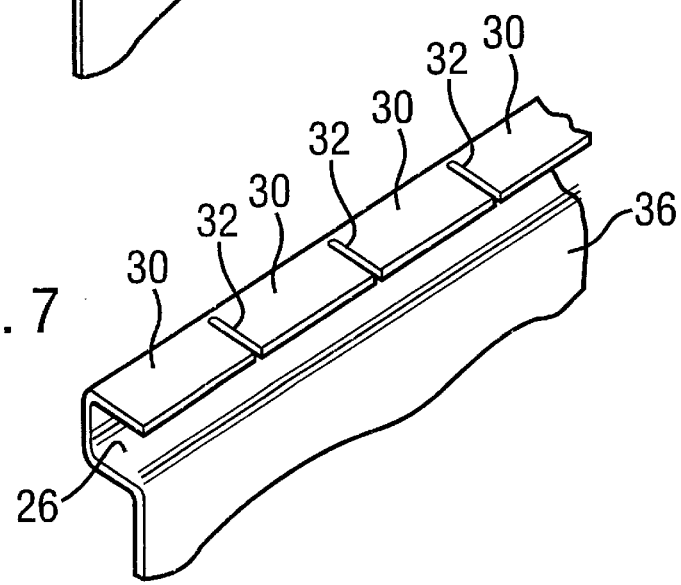
FIG. 7 is an isometric view of a modification of the embodiment shown in FIG. 6.

FIG. 6 is an isometric view of part of a side wall of an alternative form of assembly according to the invention. In this embodiment the flange 28 is formed directly from the sheet that forms the side wall 36 of the frame and slots 32 are cut therein as far as the plane of the side wall in order to divide it into sections 30. A separate strengthening member 26 in the form of a beam of "L"-shaped cross-section is attached to the side wall 36 of the frame. If desired, the strengthening member could be formed in a side wall 36 of the frame by pressing the sheet from which the side wall is formed to form an outwardly oriented ledge as shown in FIG. 7.

Figure 8:
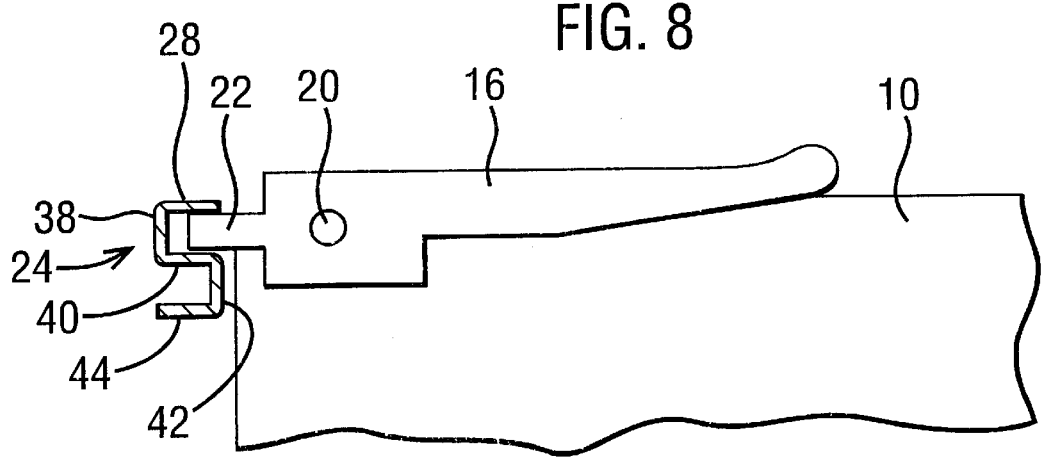
FIG. 8 is a section through part of another embodiment of the present invention.

FIG. 8 shows a further form of assembly according to the invention in which the flange 28 on which the projection 22 of the lever arm 16 bears forms part of a beam 24 of substantially "S"-shaped cross-section. The outermost part of the beam 24 against which the projections 22 of the lever arms bear during insertion of the daughterboards and during retention thereof within the frame is divided into sections for each daughterboard in the same manner as shown in FIGS. 3 to 6, while the remaining four surfaces 38, 40, 42 and 44 are continuous and provide rigidity to the structure. This design of beam will exhibit stiffness both in the direction of insertion and removal of the daughterboards (vertically as shown in FIG. 7) and also in the plane of the daughterboards (horizontally as shown in FIG. 7) and may be employed for example where the frame forms a card cage within a larger structure and so no side wall of the frame may be present on either or both sides thereof.

It would be possible, in the arrangement as shown in FIG. 8, for the slots or slits in the beam 24 to extend further and to divide at least part of the surface 38 into sections, thereby allowing a greater degree of flexing of the sections 30 although the overall stiffness of the beam would be reduced to some extent.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An electronics assembly which comprises a frame that contains a motherboard and a plurality of daughterboards that extend in a plane generally perpendicular to the plane of the motherboard and are connected to the motherboard by means of connectors, the frame having:
   (i) an opening opposite the motherboard to allow insertion of the daughterboards into the frame or removal of the daughterboards from the frame in a direction normal to the plane of the motherboard;
   (ii) an injector/ejector mechanism for each daughterboard that is located on the daughterboard or the frame and engages the frame or the daughterboard respectively in a region adjacent to the opening; and
   (iii) a flange that extends therealong at or adjacent to the opening and on which the injector/ejector mechanism of each daughterboard is attached or engages at different locations along the length thereof,
   wherein the flange is divided into separate sections that correspond to the different locations, by slots or slits that extend from an edge of the flange to allow each section of the flange to flex during insertion of a daughterboard without the flexing affecting the position of any adjacent section of the flange with respect to the motherboard and thereby accommodate differences in lengths of the daughterboards.

2. An assembly as claimed in claim 1, wherein the injector/ejector mechanism for the daughterboard comprises a lever arm that is located on the daughterboard and engages the flange or is located on the flange and engages the daughterboard.

3. An assembly as claimed in claim 2, wherein the lever arm is located on the daughterboard and engages the flange.

4. An assembly as claimed in claim 1, wherein the frame has a strengthening member extending along a side thereof in the region of the opening in order to provide the frame with rigidity in the plane of the daughterboards.

5. An assembly as claimed in claim 4, wherein the strengthening member extends in parallel to, and adjacent to, the flange.

6. An assembly as claimed in claim 4, wherein the strengthening member and the flange are formed from the same element.

7. An assembly as claimed in claim 6, wherein the strengthening member and the flange are formed from a beam having a substantially "C" or "S" shaped cross-section.

8. An assembly as claimed in claim 4, wherein the strengthening member is arranged on the side of the flange, between the flange and the motherboard.

9. An assembly as claimed in claim 8, wherein the injector/ejector mechanism bears on the flange when the daughterboard is inserted into the frame and bears on the strengthening member when the daughterboard is removed.

10. An assembly as claimed in claim 1, wherein the flange is divided into the separate sections by slots or slits in the flange.

* * * * *